(12) United States Patent
Bierer

(10) Patent No.: US 10,459,022 B1
(45) Date of Patent: Oct. 29, 2019

(54) LONG RANGE PHASING VOLTMETER WITH ROBUST PHASE TRANSMISSION

(71) Applicant: Walter S. Bierer, Ridgeway, SC (US)

(72) Inventor: Walter S. Bierer, Ridgeway, SC (US)

(*) Notice: Subject to any disclaimer, the term of this patent is extended or adjusted under 35 U.S.C. 154(b) by 211 days.

(21) Appl. No.: 15/788,517

(22) Filed: Oct. 19, 2017

(51) Int. Cl.
*G01R 29/18* (2006.01)
*G01R 25/00* (2006.01)

(52) U.S. Cl.
CPC ........... *G01R 29/18* (2013.01); *G01R 25/005* (2013.01)

(58) Field of Classification Search
CPC .............................. G01R 29/18; G01R 25/005
See application file for complete search history.

(56) References Cited

U.S. PATENT DOCUMENTS

| | | | |
|---|---|---|---|
| 6,459,252 B1 | 10/2002 | Bierer | |
| 6,617,840 B2 | 9/2003 | Bierer | |
| 6,642,700 B2 | 11/2003 | Slade et al. | |
| 6,734,658 B1 | 5/2004 | Bierer | |
| 7,109,699 B1 | 9/2006 | Bierer | |
| 7,808,228 B1 | 10/2010 | Bierer | |
| 8,283,910 B1 | 10/2012 | Bierer | |
| 8,283,911 B1 | 10/2012 | Bierer | |
| 8,970,204 B1 | 3/2015 | Bierer | |
| 9,429,597 B1 | 8/2016 | Bierer | |
| 2007/0098049 A1* | 5/2007 | Sharp | H04B 1/69 375/146 |
| 2007/0165679 A1* | 7/2007 | Kagawa | H04J 14/08 370/516 |
| 2014/0327565 A1* | 11/2014 | Reimann | G01S 5/02 342/105 |

* cited by examiner

*Primary Examiner* — Jeff W Natalini
(74) *Attorney, Agent, or Firm* — Nexsen Pruet, LLC; Michael A. Mann

(57) ABSTRACT

A long distance wireless phasing voltmeter has a first unit that uses two data bits per second to modulate a radio frequency carrier wave for simplex transmission to a second unit. Two bits define by their separation the phase difference between a voltage signal waveform on a reference conductor and a universal waveform generated from a GPS Pulse. The second unit also generates a universal waveform from a GPS Pulse and compares it to the voltage signal waveform on a local field conductor to obtain a second phase difference. The second unit compares the two phase differences to determine grid frequency, absolute phase angle, phase difference, phase rotation, and phase sequence between the reference conductor and the field conductor. Two pulses can be transmitted more reliably over data links miles apart than a longer signal and even when the data transmission occurs over a cell phone data link.

15 Claims, 3 Drawing Sheets

LONG RANGE PHASING VOLTMETER WITH ROBUST PHASE TRANSMISSION

TECHNOLOGY FIELD

The present application is related to high voltage phasing voltmeters, and more particularly, to phasing voltmeters that use communication links to transmit phase information, such as that disclosed in U.S. Pat. No. 8,283,911.

BACKGROUND

Three-phase high-voltage distribution and transmission lines consist of three energized conductors and a fourth conductor that is the neutral or "ground" conductor. Each of the three energized conductors carries an electrical voltage that varies in magnitude at the same frequency but the phase of the voltage carried by each conductor is displaced by a phase angle of 120 degrees. These three conductors are generally identified as the A, B, C or 1, 2, 3 conductors, or equivalent, depending on the utility, to tell them apart. In the simplest arrangement, the first phase, which may be the A or 1 conductor, serves as the reference phase and is arbitrarily designated to be 0 degrees, making the next phase 120 degrees displaced from the first and the last phase 240 degrees displaced from the first.

When two sets of high voltage distribution and transmission lines are to be connected, the phases of each line must match: an A phase conductor of one set is to be connected to an A phase conductor of the other set, and so on for each of the conductors. In total, there are six possible ways to attach any two sets of three conductors. Each of these six different connections will result in a different outcome for the device being powered—an outcome that is significant. Incorrectly-wired three-phase transformer banks, consisting of three individual transformers, for example, can produce phase angles between 0 and 360 degrees in 30 degree steps. Accordingly, correct phase identification prior to connecting conductors is an important practical and safety concern to those who maintain high voltage distribution and transmission systems.

Unfortunately, the phase identity of an individual conductor may be difficult to trace in overhead distribution and transmission systems, and very difficult to trace in underground electrical systems, which may extend for many miles. Moreover, unauthorized digging or trenching up of an underground electrical system, unfortunately a common occurrence, may sever conductors and result in loss of phase identification. Natural disasters such as accidents, hurricanes, tornadoes, forest fires, high winds, snow, ice, earthquakes, floods, etc. may also result in loss of phase identification in above-ground and underground transmission systems. Construction and restoration of these systems and verification of system records require accurate phase identification, conductor tagging, and mapping of the electrical transmission lines.

Measuring instantaneous voltages of two conductors is part of the process of determining their time-varying voltages. When conductors are far apart, their separation distance introduces errors in comparing any two measurements. Eliminating, correcting or avoiding those error is vital to correctly identifying the phases of two separated conductors. Safely making these connections with minimum use of communications bandwidth and a minimum amount of data transfer is advantageous simply because the communications may be taking place under difficult circumstances, or over great distances, and the transmission errors that will often occur under these circumstances can have serious consequences.

Measuring the phase difference indirectly between the voltages on electrical conductors per se is known. One system, disclosed in U.S. Pat. No. 6,642,700 issued to Slade et al and assigned to Avistar Inc., identifies phase angles of electrical conductors in remote locations by measuring the time delay between an external clock source and a zero crossing of the waveform. A time tag is associated with that time delay and transmitted over a full-duplex communications link between a field unit and a reference unit. At the reference unit, the phase angle is calculated from the time tag and displayed. The Avistar system uses the global positioning satellite (GPS) system as its external clock for determining the time delay. In order for this system to operate in real time, it requires either a half-duplex or full duplex, full-time, communications link of relatively high speed to transfer the time tag and the voltage information.

Another phase angle measurement system is described in U.S. Pat. Nos. 6,734,658 and 7,109,699, issued to the present inventor. In this system, a signal that has been corrected for capacitive charging currents is obtained by a master probe measuring the voltage carried by a conductor in the field. The phase of a signal from the master probe is compared to the phase of another signal from a supplemental probe that has measured a reference voltage and is then transmitted wirelessly and in full duplex from the supplemental probe. The phase difference is then displayed by the master probe. This system compensates for the phase shift introduced when a signal is sent from one probe to the other. The transmitted voltage signal is encoded onto a carrier wave by modulating that wave with the voltage information. This system also requires the use of a full-time half-duplex or a full duplex communications channel of relatively high speed.

A third system is described in U.S. Pat. Nos. 6,734,658, 7,808,228, 8,283,910, and 8,283,911, issued to the present inventor. In this system, the phase of a voltage carried by a reference conductor is measured by a reference probe and compared to the phase of a precision 60 Hz waveform generated from a GPS receiver signal. The phase difference between these two waves, in the form of a nine-bit data signal is transmitted over a distance, perhaps miles, to a receiver that decodes the data signal and uses another precision 60 Hz waveform generated by another GPS receiver to re-create a surrogate reference wave identical to the original reference voltage. This surrogate wave is forwarded to a (nearby) meter probe that is measuring the voltage on a field conductor. The meter probe can then compare the two waves to determine the phase angle difference between them. This system represents an improvement over the previous two systems relating to the communications requirements because it only requires a low-speed, simplex data channel.

These three prior art systems use different ways to obtain and compare signals that represent the phases of the voltages carried by the reference and field conductors and have different communications requirements. The Avistar system compares time tags of the field and reference voltage signals, wherein the time tag of each is the difference between a GPS time and the zero crossing time of the alternating voltage, to determine the phase difference between the two time-varying voltages.

The first Bierer system compares the phase of the reference conductor voltage to that of the field conductor voltage directly but compensates for the phase shift of the transmitted reference voltage resulting from the transmission distance to the master probe measuring the field conductor voltage.

The second Bierer system determines the phase angle between a reference conductor voltage and a precision 60 Hz waveform generated from a GPS signal. This phase angle is transmitted to a distant receiver where a surrogate of the original reference conductor voltage is being re-created. The phase difference between the surrogate waveform voltage carried by a field conductor are then compared.

There remains a need for high voltage phasing voltmeter that is accurate, easy to read, and useable when the high voltage distribution or transmission lines are many miles apart or when the electric power grid is not operating at its full nominal frequency. Therefore, a system that meets this need can operate notwithstanding lower quality data communications over greater distances, such as cell phone data links, and still accurately and reliably enable the utility worker to determine the phases of electrical conductors.

SUMMARY

According to its major aspects and briefly recited, herein disclosed is a long-range, wireless, phasing voltmeter system that determines the instantaneous phase angle difference between the voltages carried by two electrical conductors that may be separated by many miles. The present system, moreover, can use a communications channel, perhaps even a marginal communications channel such as a simplex communications system and cellular data link because it has small data transfer requirements. With the present method and system, it is possible to determine phase information of any conductor anywhere on an electric power grid with respect to a single designated reference conductor and do so in spite of electrical interference, distance, and other factors that might affect the quality of the communication link.

A feature of the present disclosure is the use of the Global Positioning Satellite (GPS) system clock frequency to generate a precision waveform so that a phase angle difference can be obtained with the voltage signal from both the reference source and the field source. The GPS one-pulse-per-second clock frequency is used in the present disclosure to create a precision frequency signal that has the same frequency as the voltage frequency on an electrical conductor so that the phase difference between the voltage signal on the conductor and of the precision frequency signal is always between 0 and 360 degrees. Importantly, the GPS clock frequency received by the first unit for generating that precision frequency signal is in phase with a precision frequency signal generated by the second unit at a field location regardless of the number of miles separating them because a GPS pulse rises at all locations at the same time. Accordingly, no distance-dependent adjustment is required.

A feature of the disclosure is that the instantaneous phase difference between the standard wave form generated from the one-pulse-per-second GPS signal and the wave form on the reference electrical conductor at a reference location is represented herein using two digital pulses. The phase difference is represented proportionally by the duration of the interval between those two pulses. Thus, rather than coding the phase difference using nine bits, it is coded with two bits, a start bit and a stop bit that are spaced apart by a time interval proportional to the size of the phase difference These and other features and their advantages will be apparent to those skilled in the art of electric utility high voltage measurements from a careful reading of the Detailed Description of the Disclosure accompanied by the following drawings.

BRIEF DESCRIPTION OF THE DRAWINGS

In the figures.

DETAILED DESCRIPTION

Figure 1:
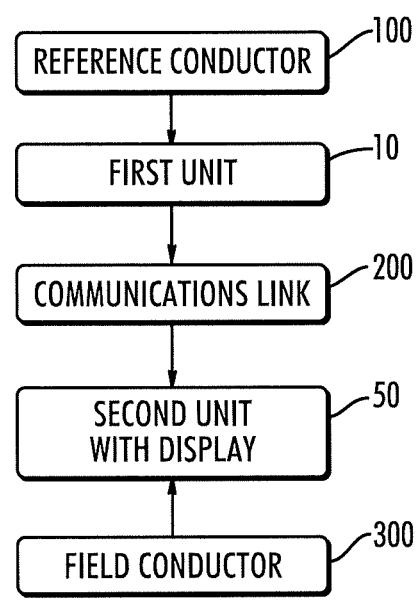
FIG. 1 is a simplex radio communications system connecting a first unit and a second unit for measuring phase angle difference between a reference and a field conductor, according to an aspect of the disclosure.

Disclosed herein is a long range phasing voltmeter system that improves existing long range phasing voltmeter systems. The improvements lie in the system's ability to use even a marginal communication channel with minimum data speed and throughput requirements. The device disclosed herein accurately determines multiple parameters of an electrical system, such as phase, phase angle, phase sequence, and phase rotation, and operates when the electrical conductors are separated by a distance of many miles and when the grid is not operating at its normal operating frequency.

The present disclosure may be applied to elements of the phasing voltmeter system disclosed and described in U.S. Pat. No. 6,734,658 that includes a supplemental probe, as well as to the systems disclosed in commonly-owned U.S. Pat. Nos. 7,808,228, 8,283,910, and 8,283,911.

The supplemental probe described in U.S. Pat. No. 6,734,658 measures the time-varying voltage on the reference conductor at a reference location. The term "supplemental" as used in U.S. Pat. No. 6,734,658 is replaced herein with the term "first" or "reference." The reference probe measures the voltage on an arbitrarily-designated reference conductor, which can be any conductor on the grid system. Alternatively, the first probe and the reference conductor may be replaced with a hardwired configuration based on the designation of a single voltage signal used as a system-wide "reference source." For example, a reference source may be a conductor designated at a reference location such as an electrical power plant connected to the grid. In that configuration, no reference probe, in the sense of a portable measuring device, is needed. Instead, a "reference source" of a voltage signal that is equivalent to the information transmitted by the supplemental probe in U.S. Pat. No. 6,734,658. Therefore, for convenience, when the term "reference source" is used herein, it includes either a first reference probe in contact with a reference conductor or the hardwired configuration of a reference source of an alternating current voltage signal.

Typically, the utility worker needs to know what phase the conductor, or field source, at a field location carries with respect to that of a reference conductor or, alternatively, what the phase angle differences are among several field conductors so that only those conductors of the same phase would be connected to each other. It is also possible that the utility worker may wish to know the phase of a particular conductor with respect to the utility's reference source.

The term phase difference and phase angle difference are used herein interchangeably because phase difference is often expressed as an angle between zero and 360 degrees or zero and 2π radians. Regardless of the manner in which phase angle difference is expressed: degrees, radians, or otherwise, the present disclosure determines phase angle difference and displays it in the manner of choice.

A voltage on a conductor is assumed to be a time-varying voltage, that is, the time-varying voltage of an alternating current system which has a frequency, for example, 60 Hz or 50 Hz. A voltage signal is an analog or digital representation of the voltage on such a conductor. The terms telecommunications link or communications link are used herein interchangeably to refer to means for transmitting information, which may be wireless, or partially wireless, and which communications link uses a carrier wave to send information as a digital or analog signal, or as a combination of a digital and analog signal.

The designations of first unit and second unit are arbitrary but, for convenience, the first unit is the unit assumed to be nearest to the reference conductor. The second unit, that is, the one being used by a technician at a location away from the first unit and first conductor, is used to determine the phase difference between the phase of the voltage on a conductor in the field (i.e., away from the reference conductor) with respect to the phase of the voltage of the designated reference conductor.

The second unit includes a field probe that can detect a voltage carried by a field conductor and generate a voltage signal from that detected voltage. The first unit may have a first probe that can detect the voltage from the reference conductor and generate a reference voltage signal from that detected reference voltage. The first unit may be proximate to the reference probe; the second unit may be proximate to the field probe.

The present system determines phase information between a reference conductor and a field conductor using a first unit, a second unit, and a communications link, as shown in FIG. 1. A first conductor is designated arbitrarily as the reference conductor 100, and the phase of the alternating current on that conductor is compared to the phase of the alternating current on a second conductor designated as the field conductor. A first unit 10 is connected electrically to reference conductor 100 in order to determine information about the phase of the alternating current on reference conductor 100. At another location, which may be miles away, above ground or below ground, a second unit 50 is connected to a field conductor 300 that may be carrying an alternating current having the same phase or a different phase than that carried by reference conductor 100.

Second unit 50 will receive the phase information determined by first unit 10, which has been sent over communications link 200, such as a cellular data link, and will also obtain phase information from its field source for comparison. The comparison will reveal the absolute phase, the phase difference, the phase rotation, the phase sequence, and grid frequency of the alternating current carried by the field conductor 300 with respect to reference conductor 100.

Figure 2:
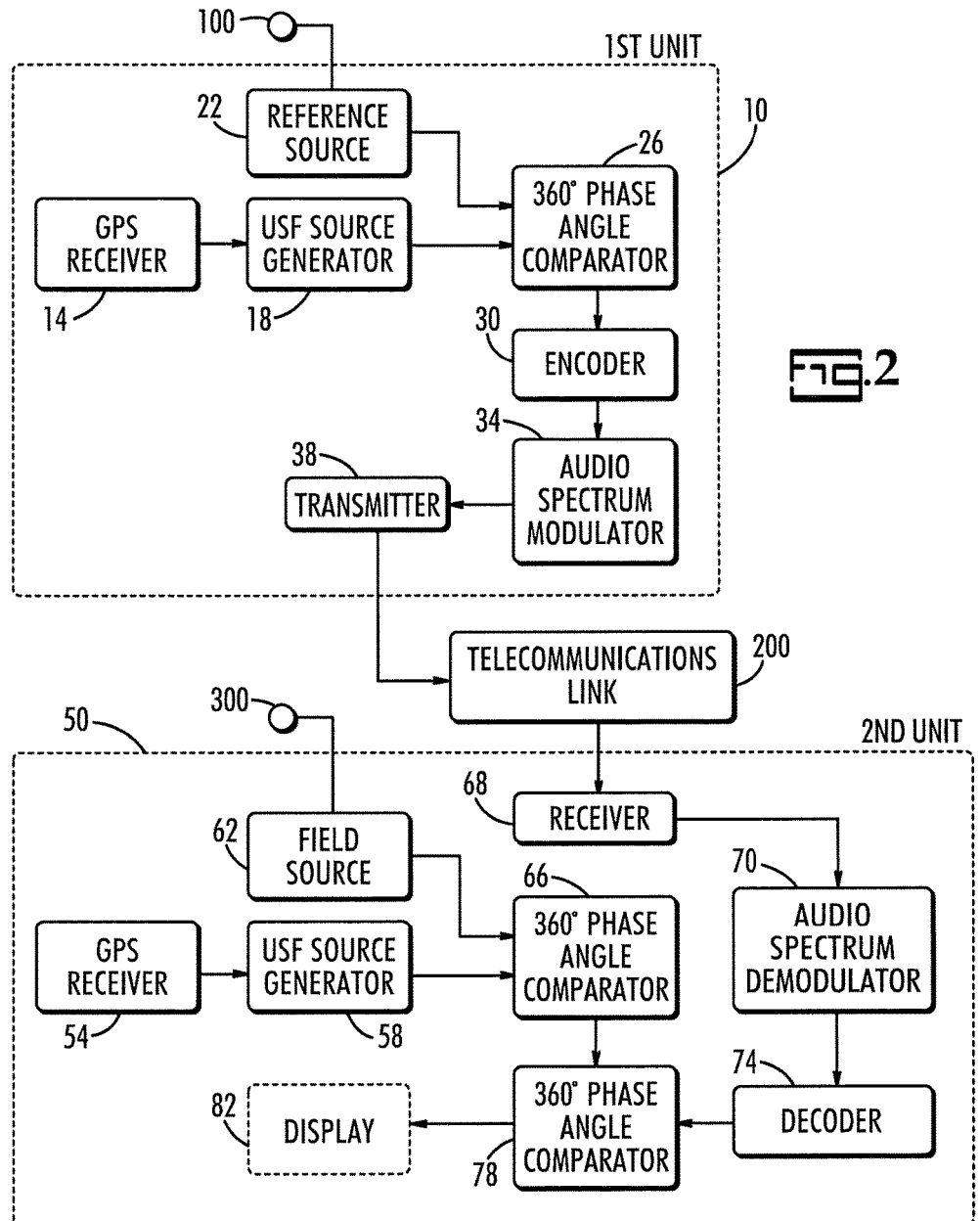
FIG. 2 is a schematic description of the first unit and second connected by a simplex telecommunications link, according to an aspect of the disclosure.

FIG. 2 shows the relationship of the components of first unit 10 and second unit 50 plus reference conductor 100 and field conductor 300 and telecommunications link 200 that enables first unit 10 and second unit 50 to communicate phase information.

Figure 3:
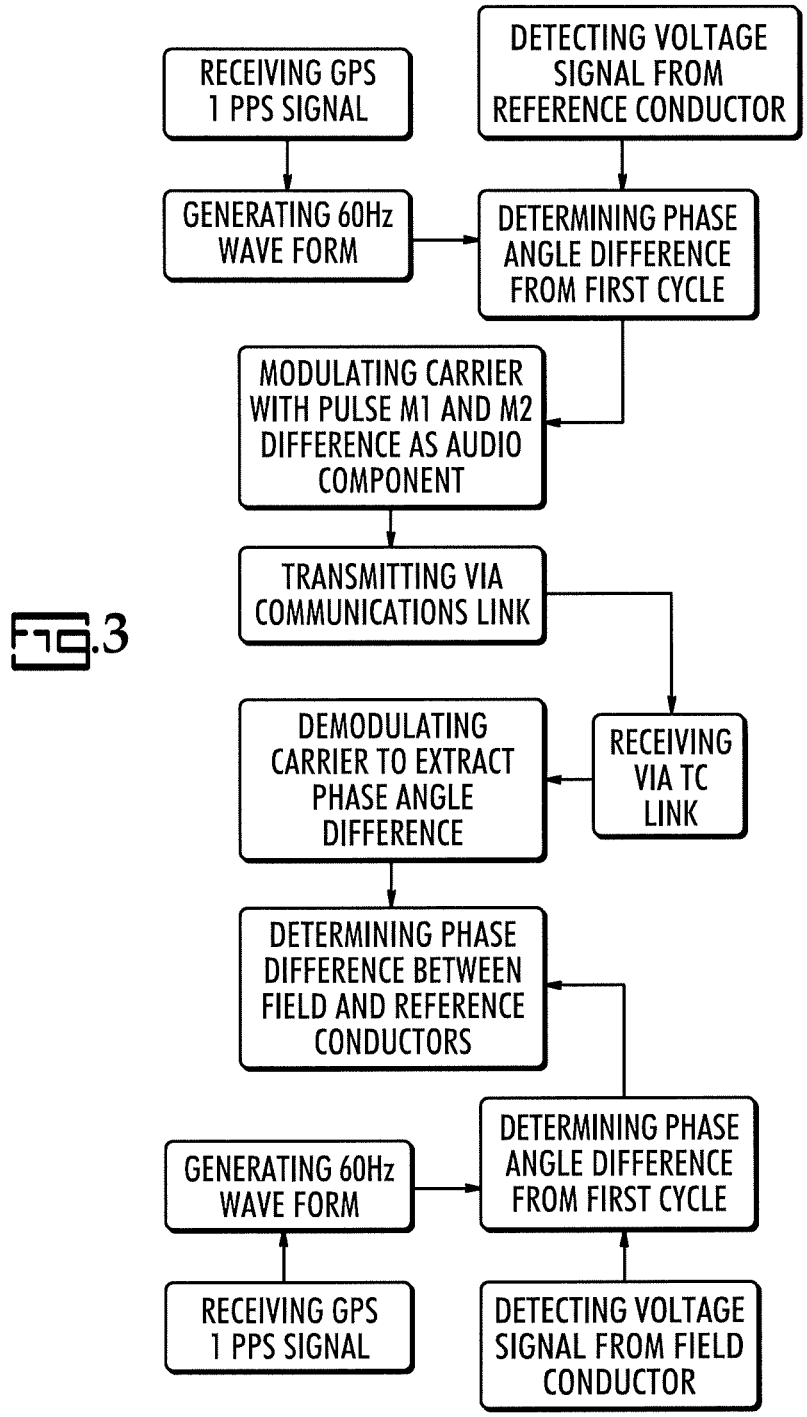
FIG. 3 is a flow diagram of the present method, according to an aspect of the disclosure.

FIG. 3 shows a flow diagram of the signals, waveforms and phase differences that are used to determine the phase difference between the voltage signal on reference conductor 10 and field conductor 50.

As shown in FIGS. 2 and 3, first unit 10 includes a global positioning satellite (GPS) receiver 14 that receives the steady one-pulse-per-second pulses train from the global positioning satellite (GPS) system. That GPS system establishes the standard frequency of the electrical grid system, such as 60 cycles per second (CPS), in the United States. A waveform generator 18 generates a standard waveform from a single GPS pulse received by GPS receiver 14.

First unit 10 then compares the constructed waveform and the first voltage signal using a first phase angle comparator 26 to determine the instantaneous phase difference. To make that determination, first unit 10 looks for any repeating electrical value or feature in the reference voltage. This electrical value or feature may be, for example, a change from negative to positive or positive to negative in a voltage or a positive-to-negative change in the first derivative of the voltage—but any characteristic of a sinusoidally varying voltage can be used that is readily detectable.

The time between receipt of the first cycle of the constructed waveform after the GPS pulse to the detection of the significant repeating electrical feature at T1 is given in degrees. At 60 Hz, that time difference T1 is represented by a calculable number of degrees (16.667 milliseconds equals 360 degrees; 1 millisecond equals 21.6 degrees).

The occurrence of the significant repeating feature" triggers pulse M1 at time T1. The M1 pulse is followed by an arbitrary, preselected delay, such as, for example, 50 milliseconds. An encoder 30 adds an additional amount of time to that preselected delay based on the number of degrees of the phase difference. The amount of phase difference in degrees may be represented by the same number in milliseconds. For example, after the arbitrary 50 milliseconds of delay after pulse M1 at T1, a phase difference of 120 degrees is represented by an additional delay of 120 milliseconds. The sum of the arbitrary delay of 50 milliseconds and the phase difference-represented delay of 120 milliseconds, is 170 milliseconds at T2 when the second pulse, M2, is transmitted by transmitter 38 to second unit 50 via telecommunications link 200. An audio spectrum modulator uses the two audio frequency pulses, M1 and M2, to modulate a radio frequency carrier wave.

The phase difference represented in milliseconds is then received by a receiver 68 in second unit 50. An audio spectrum demodulator extracts the two pulses, M1, and M2, and their time difference, less the arbitrary additional delay, and decodes that time difference back into degrees. As an example, if the difference between T1 and T2 is 290 milliseconds, that difference, less the 50 milliseconds of arbitrary delay, leaves 240 milliseconds, which represents 240 degrees of phase difference, which is the number of degrees elapsing between the GPS pulse on which the standard waveform was generated by first unit 10 and the occurrence of the significant repeating feature on the waveform of reference source 22.

The arbitrary delay, 50 milliseconds in the present example, is to allow resolution of the first and second pulses, especially when the phase difference is small or zero. An electronics circuit will not be able to resolve or detect two distinct pulses if the time between them too short, and it is possible the phase difference could be zero. Accordingly, introducing an arbitrary delay removes the issue of resolution. A shorter preselected delay is preferred over a longer one and the quality and cost of the specific components of the circuitry will determine its ability to resolve two pulses occurring within a small fraction of a second apart.

The choice of one millisecond to represent one degree is also arbitrary, with 1000 milliseconds in a second, a longer or shorter time could be used as an equivalent to one degree of phase difference as long as a phase difference of up to 360 degrees and the arbitrary delay can be represented within one second.

An important feature of the present disclosure is the transmission of the instantaneous phase difference from first unit 10 to second unit 50, which may be transmitted only once per second following the 1 pps standard second frequency. The length of time required for this transmission may be on the order of milliseconds, because the phase difference is a number between 0 and 360 and thus requires only two bits of data to be transmitted. The remainder of the time the communication channel may be idle. This feature allows the transfer of 100% of the phase information via a part time, one-way, simplex communication link between the first unit 10 and the second unit 50 requiring a lower throughput data rate as opposed to either a full-time, simplex or a full-duplex communications system requiring a much higher throughput data rate, as taught by the prior art.

At a location near a field conductor 300, second unit 50, or "field" unit, is connected to field conductor 300 via a field source 62. Field source 62 outputs a field voltage waveform from field conductor 300. A GPS receiver 54 in second unit 50 receives the one-pulse-per-second signal from the GPS system. Frequency generator 58 generates the standard waveform identical to that generated by frequency generator 18 in first unit 10 from the one-second-per-pulse GPS signal. This standard waveform has the same frequency and phase as the first standard frequency waveform generated by frequency generator 18 in first unit 10. Using the waveform produced by field source 62 of second unit 50 and the standard waveform produced by waveform generator 58, a first phase angle comparator 66 on second unit 50 determines the instantaneous phase difference between them.

The transmitted carrier wave including the coded, first reference phase difference is received by receiver 68 of second unit 50. The coded, first reference phase difference is extracted from its carrier wave by demodulator 70 which demodulates the carrier wave. The first phase difference received from first unit 10 now decoded, is forwarded to a second phase angle comparator 78 in second unit 50. The results of the comparison are displayed by display 82 at second unit 50. Display 82 may indicate the phase angle difference as well as the other parameters such as phase sequence and phase rotation.

The phase difference between the phase difference from first phase angle comparator 26 of unit 10 and the phase difference from first phase angle comparator 66 of unit 50 are compared by second phase angle comparator 78 of unit 50 to yield the phase difference between reference source 22 and field source 62.

The reference and field conductors 100, 300, do not have to be a particular distance apart but may be separated by any distance as long as there is at least a minimal telecommunications link between them.

The system's carrier wave may be a radio frequency carrier wave and the modulator may modulate the carrier wave using an audible signal. The system's transmitter may a simplex transmitter and may transmit the modulated carrier wave at regular intervals which may be one second apart. The phase angle difference may be represented by as few as 2 digital bits per second transmitted at intervals one second apart via a simplex communications system.

First unit 10 and second unit 50 may include probes as described in U.S. Pat. No. 6,734,658 (allowing for the changes in terminology previously described) that measure the voltages of first conductor 100 and second conductor 200, respectively, and produce corresponding digital or analog voltage signals.

First and second units 10, 50, may be separated by a distance, perhaps a distance of many miles. Indeed, voltages from the reference and field conductors 100, 300, may be compared to determine their phases and phase angle difference without regard to the distance between them and without correcting for that distance. First unit 10 and second unit 50 may communicate through any type or class of telecommunications link 200, including one using a wireless signal, preferably a radio frequency signal that permits the signal to be transmitted accurately over long distances despite objects and topographic features that exist between first unit 10 and second unit 10. That telecommunications link may be a simplex system rather than duplex, as it needs to transmit in only one direction for the present system to operate.

GPS receivers 14, 54, are an inexpensive, off-the-shelf item capable of providing a stream of pulses at the rate of 1 pps synchronized to the standard second, plus or minus 1 micro-second, and referenced to Universal Standard Time. Any number of these 1 pps GPS receivers will produce output pulses that will all rise in unison, regardless of where they are on earth. The 60 Hz (and 50 Hz) Universal Standard Frequency Source ("USFS") is a term used to describe universal frequency generators 18, 58. It is a microprocessor with its own precision internal clock used to generate a local precision frequency source of 60.00000 Hz (or 50.00000 Hz in locations where the electrical transmission frequency is 50 Hz). The number of zeros represents its precision. The 60 Hz frequency generator 18, 58, as described herein, becomes a new standard since it is based on the 1 pps output of the GPS receivers 14, 54, and is not merely synchronized with the GPS signal. Each cycle of the 60 Hz USFS generator 34 output will have the same frequency and phase regardless of where it is anywhere on earth, when it is receiving the 1 PPS signal from a GPS receivers 14, 54.

The output of the 60 Hz USFS generator 24 is a single waveform that may be sinusoidal or have some other shape, and preferably has a shape that has a fairly steeply rising edge such as a square pulse or saw-tooth pulse.

The phase angle difference from first unit 10 may be used to modulate an audible signal by a frequency-shift keying generator using frequency shift keying, preferably in the audio frequency range of 1200 and 2200 Hz for the digital pulses. Frequency shift keying a well-known method of modulating a carrier. Alternately, the pulsed data stream containing the phase angle difference information is of such short duration that it may be converted to synthesized speech or dual-tone multi-frequency (DTMF), audio frequency spread spectrum or synthesized speech or other known technique for transmitting audible signals that have been used to modulate a radio frequency carrier.

Note that the time signal from the GPS system is not needed, either to mark the time or to mark a difference between two instants in time. Rather, first and second phase angle comparators 26, 66, measure the actual phase angle between a single cycle of the 60 Hz frequency generators 18, 58, constructed from the one-pulse-per-second GPS signal from GPS receivers 14, 54, and a single cycle of 60 Hz reference frequency derived from reference conductor 100 and field conductor 300. This measured instantaneous phase difference of first unit 10 must lie between 0 and 360 degrees. It is that phase difference that characterizes the phase of the transmission from reference conductor 100 to first unit 10.

First unit 10 may include an adjustable phase shifter (not shown) that allows the user to arbitrarily designate the signal of the reference source as being any angle between 0° and 360°. If the reference conductor is known to be the "B" conductor, an adjustable phase shifter can be set to 120 degrees so that any field conductor in phase with the reference conductor will be a "B" conductor and any conductor 240 degrees out of phase with the B conductor is an A conductor. The phase angle adjuster thereby allows the electric utility to select which phase in its system it wants to establish as the leading, or A, phase.

Accordingly, the present disclosure reduces the amount of data that needs to be transmitted and eliminates the need for full- or half-duplex transmission, and optionally transmits the data at a modulation frequency so that it can be transmitted in the same manner as routine telephone conversation, as a pair of audio frequency pulses, all in order to enable simplex transmission and even marginally quality transmissions to transmit accurate phase angle information over great distances with accuracy and simplicity.

Determining instantaneous phase angle differences has a different outcome depending on whether the waveform is compared to the voltage signal or the other way around. So as long as the comparison is done consistently by first and second units 10, 50, either order will produce useful results and are equivalent.

Those skilled in the art of high-voltage measurement and transmission and grid management will appreciate that modifications and substitutions may be made to the preferred embodiments described herein without departing from the spirit and scope of the present disclosure, which is defined by the appended claims.

What is claimed is:

1. A method of determining a phase angle difference, said method comprising the steps of:
   (a) at a reference location, receiving a first 1 pps signal from a global positioning satellite system;
   (b) generating a first waveform from said first 1 pps signal;
   (c) obtaining a voltage signal from a reference source at said reference location;
   (d) determining a first instantaneous phase difference between said first waveform and said voltage signal from said reference source;
   (e) representing said first instantaneous phase difference by two pulses spaced apart by an interval proportional to said first instantaneous phase difference;
   (f) transmitting said two pulses to a field location near an electrical conductor;
   (g) at said field location, receiving a second 1 pps signal from said global positioning satellite system;
   (h) generating a second waveform from said second 1 pps signal;
   (i) obtaining a field voltage signal from said electrical conductor;
   (j) determining a second instantaneous phase difference between said second waveform and said field voltage signal;
   (k) receiving said two pulses at said field location;
   (l) converting said interval between said two pulses to said first instantaneous phase difference; and
   (m) subtracting said first instantaneous phase difference from said second instantaneous phase difference to determine a phase difference between said reference source and said electrical conductor.

2. The method as recited in claim 1, further comprising the step of transmitting said two pulses via a carrier wave.

3. The method as recited in claim 1, further comprising the step of transmitting said two pulses on a radio frequency carrier wave.

4. The method as recited in claim 1, further comprising the step of transmitting said two pulses as audio-frequency pulses on a carrier wave.

5. The method as recited in claim 4, wherein said carrier wave is modulated by frequency shift keying, dual tone multi-frequency, audio frequency spread spectrum, or synthesized speech.

6. The method as recited in claim 4, wherein said two pulses are transmitted per second.

7. A system for determining the phase angle difference, said system comprising:
   (a) a first unit in electrical connection with a reference source carrying a reference voltage, said first unit having
      (i) a first GPS receiver operable to produce a one pps signal,
      (ii) a first universal frequency source generator operable to generate a first waveform from said one pps signal, and
      (iii) a first phase angle comparator operable to determine a first instantaneous phase angle difference between said first waveform and said reference voltage; and
   (b) a second unit in electrical connection with a field conductor carrying a field voltage, said second unit having
      (i) a second GPS receiver operable to produce a one pps signal,
      (ii) a second universal frequency source generator operable to generate a second waveform from said one pps signal from said second GPS receiver,
      (iii) a second phase angle comparator operable to determine a second instantaneous phase angle difference between said second waveform and said reference voltage signal generated by said field conductor, and
      (v) a third phase angle comparator operable to determine said phase angle difference between said first and said second instantaneous phase angle differences, said phase angle difference between said first and said second instantaneous phase angle differences being the phase angle difference between said voltage on said field conductor and said reference conductor;
   (c) an encoder operable to convert said first instantaneous phase angle difference as pulses separated by an interval proportional to said first instantaneous phase angle difference;
   (d) a modulator operable to modulate a carrier wave with said pulses;
   (e) a transmitter operable to transmit said carrier wave modulated by said pulses;
   (d) a receiver operable to receive said carrier wave;
   (e) a demodulator operable to extract said pulses from said carrier wave; and
   (f) a decoder operable to convert said interval to said first instantaneous phase angle difference.

8. The system of claim 7, wherein
   (a) said encoder is carried by said first unit;
   (b) said modulator is carried by said first unit and in electrical connection with said encoder;
   (c) said transmitter is carried by said first unit;

(d) said receiver is carried by said second unit, said receiver operable for receiving said carrier wave transmitted by said transmitter;

(e) said demodulator is carried by said second unit and in electrical communication with said receiver; and (f) said decoder is carried by said second unit and in electrical connection with said demodulator.

9. The system as recited in claim 8, wherein said carrier wave is a radio frequency carrier wave.

10. The system as recited in claim 8, wherein said modulator modulates said carrier wave using an audible signal.

11. The system as recited in claim 8, wherein said modulator modulates said carrier wave using frequency shift keying.

12. The system as recited in claim 8 wherein said modulator modulates said carrier wave using synthesized speech.

13. The system as recited in claim 8, wherein said transmitter is a simplex transmitter.

14. The system as recited in claim 8, wherein said transmitter transmits said carrier wave modulated by said pulses at a regular interval.

15. The system as recited in claim 14, wherein said regular interval is one second.

* * * * *